US006416818B1

(12) United States Patent
Aikens et al.

(10) Patent No.: US 6,416,818 B1
(45) Date of Patent: Jul. 9, 2002

(54) COMPOSITIONS FOR FORMING TRANSPARENT CONDUCTIVE NANOPARTICLE COATINGS AND PROCESS OF PREPARATION THEREFOR

(75) Inventors: John H. Aikens, LaGrange Park; Harry W. Sarkas, Plainfield; Richard W. Brotzman, Jr., Naperville; Sara Helvoigt, Downers Grove, all of IL (US)

(73) Assignee: Nanophase Technologies Corporation, Burr Ridge, IL (US)

( * ) Notice: Subject to any disclaimer, the term of this patent is extended or adjusted under 35 U.S.C. 154(b) by 0 days.

(21) Appl. No.: 09/374,751

(22) Filed: Aug. 13, 1999

Related U.S. Application Data
(60) Provisional application No. 60/096,829, filed on Aug. 17, 1998.

(51) Int. Cl.$^7$ ................................................. B05D 3/02
(52) U.S. Cl. ............................... 427/383.1; 427/385.5; 427/404; 427/419.2; 427/419.5; 427/419.8; 427/444; 516/78
(58) Field of Search .......................... 427/383.1, 385.5, 427/404, 419.2, 419.5, 419.8, 444; 516/78

(56) References Cited

U.S. PATENT DOCUMENTS

| | | | |
|---|---|---|---|
| 4,431,764 A | | 2/1984 | Yoshizumi .................. 524/409 |
| 4,594,182 A | | 6/1986 | Hashimoto et al. .......... 252/518 |
| 5,460,701 A | * | 10/1995 | Parker et al. ................. 204/164 |
| 5,504,133 A | | 4/1996 | Murouchi et al. .......... 524/430 |
| 5,514,349 A | | 5/1996 | Parker et al. |
| 5,578,248 A | | 11/1996 | Hattori et al. ............... 252/518 |
| 5,593,781 A | | 1/1997 | Nass et al. .................. 428/403 |
| 5,662,962 A | | 9/1997 | Kawata et al. ............ 427/126.2 |
| 5,690,805 A | | 11/1997 | Thorn et al. ................. 205/118 |
| 5,866,287 A | * | 2/1999 | Christian et al. ............. 430/63 |
| 5,874,684 A | | 2/1999 | Parker et al. ................. 75/228 |

FOREIGN PATENT DOCUMENTS

| | | |
|---|---|---|
| EP | 0355549 A3 | 2/1990 |
| EP | 0 355 549 A2 | 2/1990 |
| EP | 0713240 A2 | 5/1996 |
| JP | 09193433 | 7/1997 |

OTHER PUBLICATIONS

Gerhard Lagely, "Colloids," vol. A7, pp. 341–367 (No Date).

Du Pont Technical Information brochure # 247232A (Sep. 1995) regarding "Zelec® ECP electroconductive powders Applications in Opaque Coatings".

Du Pont Technical Information brochure #245684A (May 1995) regarding "Zelec® ECP electroconductive powders Zelec* ECP–XC Powders for Clear, Static–dissipative Coatings".

Du Pont Technical Information brochure #247240B (Apr. 1996) regarding "Zelec® ECP electroconductive powders Zelec® ECP Grade Selection".

Du Pont Technical Information brochure #247234A (Sep. 1995) regarding "Zelec® ECP electroconductive powders".

(List continued on next page.)

*Primary Examiner*—Katherine A. Bareford
(74) *Attorney, Agent, or Firm*—Douglas S. Rupert; Wildman, Harrold, Allen & Dixon

(57) ABSTRACT

A process produces a substantially stable aqueous dispersion of metal or metal oxide particles suitable for use in forming a transparent conductive coating. The process comprises the steps of (a) adding a nanocrystalline material to water, the nanocrystalline material comprising primary particles of metal or metal oxide having a substantially spherical shape and (b) mixing the nanocrystalline material and water to form an aqueous dispersion. The process identified above, prepares a substantially stable aqueous dispersion of nanocrystalline particles, which may be used in forming a transparent conductive coating.

32 Claims, 3 Drawing Sheets

OTHER PUBLICATIONS

Du Pont Technical Information brochure #245683B (Apr. 1996) regarding "Zelec® CD–100 dispersion Solventborne of Zelec® ECP–3010–XC".

Du Pont Technical Information brochure #245682B (Apr. 1996) regarding "Zelec® CD–200 pigment concentrate Waterborne Concentrate of Zelec® ECP–3010–XC".

Du Pont Technical Information brochure #245685A (May 1995) regarding "Zelec® ECP electroconductive powders Zelec* ECP for Static–dissipative Coatings".

Ishihara Sangyo Kaisha, Ltd., Ishihara Techno Corp. brochure entitled "Electroductive Material (Anti–Electrostatic Grade) ED–FT–SN Series." (No Date).

Ishihara Sangyo Kaisha, Ltd., Ishihara Techno Corp. brochure entitled "Ultrafine Particle Size Titanium Dioxide TTO Series." (No Date).

Ishihara Sangyo Kaisha, Ltd., Ishihara Techno Corp. brochure entitled "Functional Materials of Titanium Dioxide." (No Date).

Goebbert et al., Ultrafiltration conducting memebranes and coating from redispersable, nanoscaled, crystalline SNO2: SB particles. Journal of Materials Chem. GB, The Royal Society of Chemistry, Cambridge, vol. 9, No. 1, 1999, pp. 253–258. (No Month Date).

* cited by examiner (Transparency for a film prepared by Example 8)

COMPOSITIONS FOR FORMING TRANSPARENT CONDUCTIVE NANOPARTICLE COATINGS AND PROCESS OF PREPARATION THEREFOR

CROSS-REFERENCE TO RELATED APPLICATIONS

This application is related to and claims priority benefits from U.S. Provisional Patent Application Serial No. 60/096,829 filed Aug. 17, 1998, entitled "Compositions For Forming Transparent Conductive Nanoparticle Coatings". The '829 application is incorporated herein by reference in its entirety.

FIELD OF THE INVENTION

This invention relates generally to a composition for forming transparent, electrically conductive coatings. More particularly, the present invention relates to substantially stable dispersions of nanocrystalline materials that form transparent conductive coatings.

BACKGROUND OF THE INVENTION

Transparent conductive coatings are generally characterized by low electrical resistance, a high transmittance of visible light, and good film strength. Such coatings may function to dissipate static charge, reduce electromagnetic radiation, or absorb and/or reflect specific types of radiation. Accordingly, such coatings are used in a wide range of devices, including window materials for solar cells, transparent electrodes, liquid crystal displays, reflective layers in architectural glasses, and microelectronic conductive components.

As defined in terms of sheet resistance by the U.S. Department of Defense, "conductive" is less than $10^5$ $\Omega$/(ohms per square), "static dissipative" is $10^5$–$10^9$ $\Omega$/, and "anti-static" is $10^9$–$10^{14}$ $\Omega$/.

Transparent conductive films are commonly made from an oxide semiconductor of which indium-tin oxide ("ITO"), which is an indium oxide containing a minor amount of tin oxide, is typical. In the case of conductive applications that do not require transparency, suitable electronic conductors include carbon fibers, metal fibers, metal-coated fibers, and aluminum flakes.

Two of the most common materials employed in static dissipative applications are carbon black and doped metal oxides. Sub-micron-sized antimony tin oxide (ATO) is a static dissipative material available as ATO primary particles or ATO doped $SiO_2$, $TiO_2$, or mica.

Anti-static materials are typically hygroscopic and function as "ionic conductors" by trapping a thin layer of moisture, which help prevent the accumulation of static charge. Such materials include compounds such as quaternary ammonium salts, sulfonates, and fatty acid esters.

Three known processes apply conductive films to substrates, namely (1) a process of sputtering film precursors, (2) a process of chemical vapor deposition ("CVD") of film precursors, and (3) a process of the applying film precursors from dispersion. In the case of sputtering, the substrate is masked, placed in a vacuum chamber, and the film applied during sputtering. CVD processes are similar to sputtering. In the case of dispersion, the techniques of spin coating, dip coating, or spraying may be employed to apply the dispersion to the substrate. In order to prepare film precursors for dispersion applications, sol-gel chemistry and mechanical attrition are typically employed. Sol-gel materials are organic solvent-based dispersions.

Of the processes identified above, both the sputtering and CVD processes, which require the use of complicated equipment, suffer from the disadvantages associated with high start-up and maintenance costs. Accordingly, the dispersion process of applying the film precursor is the generally preferred process of applying a film precursor.

Processes employing sol-gel dispersions are problematic, however, in that such dispersions are unstable due to ongoing chemical interactions between particles or sol-gel precursors. Consequently, large particulates or aggregates form from the dispersion, thereby yielding films of poor optical quality. Dispersion instability leads to relatively short operational lifetimes (shelf-life). For example, conventional sol-gel derived dispersions must be shipped frozen or refrigerated using dry ice, other suitable refrigerant, or using some other suitable refrigeration method, in order to reduce the continued reactivity and chemical interactions among the particles forming the dispersion, as described above. Moreover, most dispersions are formulated by adding a complex mixture of principally organic solvents. The formulations have short shelf lives, contain large conductive particles (which negatively affect optical quality), or require high cure temperatures that limit their application.

The coating composition disclosed herein forms transparent, electrically conductive coatings from nanoparticles. The preparation process disclosed herein provides a substantially stable composition suitable for use in forming transparent, electrically conductive films.

SUMMARY OF THE INVENTION

In one aspect of the present invention, a process produces a substantially stable aqueous dispersion of nanocrystalline particles for forming a transparent conductive coating. The process comprises the steps of:

(a) adding a nanocrystalline material to water, the nanocrystalline material comprising primary particles of metal or metal oxide having a substantially spherical shape; and (b) mixing the nanocrystalline material and water to form an aqueous dispersion.

In another aspect of the present invention, a substantially stable aqueous dispersion of nanocrystalline particles, which forms a transparent conductive coating, is prepared by the process identified above.

In yet another aspect of the present invention, a process is provided for applying a substantially transparent conductive film. The process comprises the steps of (a) adding a nanocrystalline material to water, the nanocrystalline material comprising primary particles of metal or metal oxide having a substantially spherical shape;

(b) mixing the nanocrystalline material and water to form an aqueous dispersion;

(c) adding a film forming agent to the aqueous dispersion;

(d) adding a diluent to the aqueous dispersion to make a formulation; and (e) applying the formulation to a substrate.

DETAILED DESCRIPTION OF THE PREFERRED EMBODIMENTS

Figure 1:
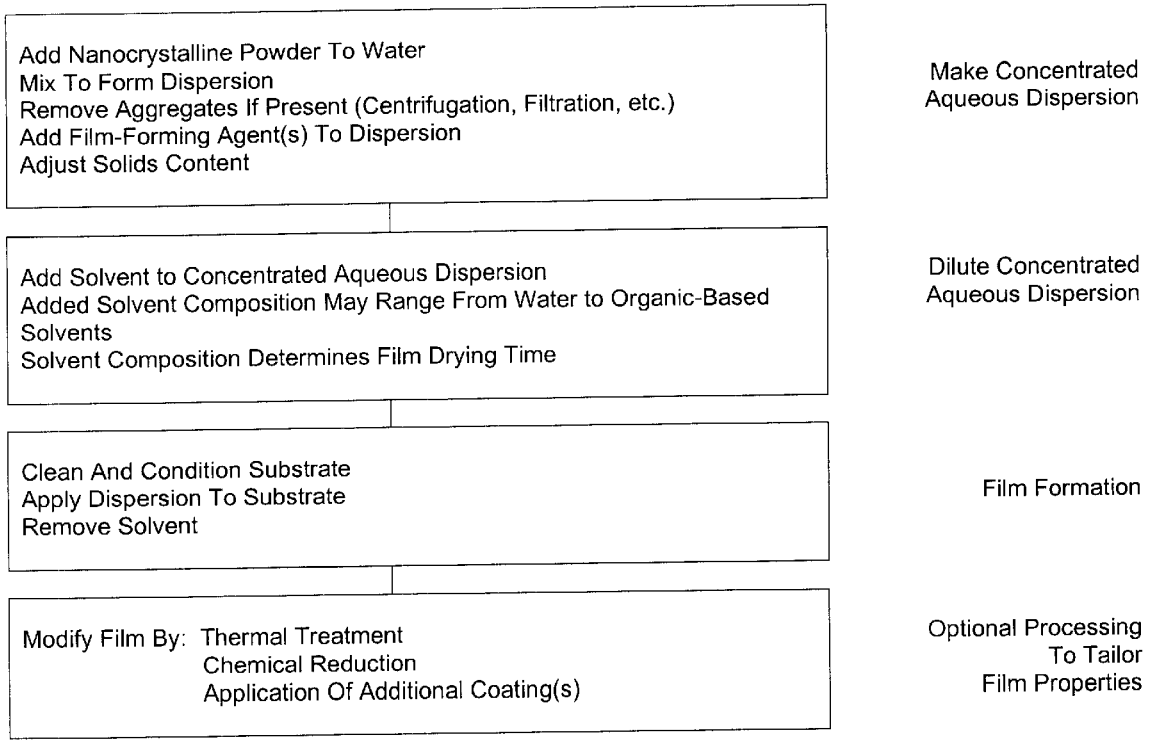
FIG. 1 is a flow diagram showing a process for making conductive transparent films in accordance with the present invention.

Turning first to FIG. 1, there is shown a flow diagram of a process for making conductive transparent films in accordance with one embodiment of the present invention. As shown in FIG. 1, nanocrystalline materials are processed to form transparent conductive ("TC") films. More particularly, there is shown a process for preparing aqueous dispersions of nanocrystalline materials for use in forming transparent conductive coatings. There is also shown a flow diagram of a process for depositing the formulated dispersions of nanocrystalline materials to produce TC films of uniform, controlled thickness, composition, and morphology. Also shown in FIG. 1 is a flow diagram of a process for controlling the characteristics of the deposited nanocrystalline material film to affect film properties.

As shown in FIG. 1, the first process step is adding 100% crystalline nanoparticle material (of less than 100 nm with clean defined interfaces) to water. Alternatively, acidic or basic aqueous solution may be used instead of de-ionized water for acidic or basic nanocrystalline powders, respectively. Nanocrystalline material useful in the present invention include, but are not limited to, doped tin oxides, CuO, iron oxides, platinum, palladium, silver and gold. The nanoparticulate materials useful in the present composition and process can be discreet primary particles of substantially spherical shape. Such nanocrystalline materials, and a process and apparatus for making such nanocrystalline materials, are disclosed and claimed in U.S. Pat. Nos. 5,874,684, 5,514,349, and 5,460,701, each of which is hereby incorporated herein by reference in its entirety. Nanosized indium tin oxide (ITO) is available as an organic-based particulate sol manufactured by dispersing ITO in a solvent, or in a binder solution that comprises a binder polymer dissolved in a mixed organic solvent (at least one polar solvent and at least one non-polar solvent).

The nanocrystalline particles should be present in an amount at least sufficient to provide an electrically conductive coating when the composition is diluted and applied to a substrate. The nanocrystalline particles may be present in amounts ranging from about 1 to about 40% by weight of the dispersion, most preferably from about 7 to about 30% by weight of the dispersion.

The nanocrystalline particles and solvent are then subjected to high shear mixing such as by a mixer emulsifier, or other suitable mixing method, for a time sufficient to form an aqueous dispersion. The solution is then centrifuged, or clarified of aggregates by other suitable method, the supernatant is collected and filtered, thereby providing a concentrated aqueous metal oxide solution that is relatively free of aggregates.

A film forming agent is then added to the dispersion. The film-forming agents may be polymeric containing at least one hydroxyl group, such as, but not limited to, polyvinyl alcohol-, polyethylene glycol-, or cellulose-based polymers. The film forming agent may also be a surfactant, such as but not limited to, organosilanes, ethoxylated alcohols, phosphate esters, glycerol esters, aliphatic polyethers and ethoxylated fatty esters. The film forming agent should be present in an amount effective to provide uniform, defect-free films. The film-forming agent is preferably added to the dispersion at up to 25% by weight of the nanocrystalline material content. The solids content of the aqueous dispersion may then be adjusted by dilution.

This process yields a concentrated aqueous dispersion of the subject nanocrystalline particles that is substantially stable. By substantially stable, it is meant that the particles do not readily agglomerate, aggregate, or undergo further substantial chemical activity. In other words, there is substantially no latent chemical activity between the nanocrystalline particles.

As shown in FIG. 1, the concentrated aqueous dispersion of nanocrystalline particles may be used to make a film by applying the dispersion to a substrate. More particularly, the dispersion is diluted to make a formulation by mixing an appropriate weight percent of a solvent mixture to make the formulation 0.1 to 5 wt % solids. The diluent composition may range from water to organic-based solvents. The diluent composition is typically a mixture of low-, medium-, and high-boiling point solvents. Suitable organic diluents include, but are not limited to, alcohols, ketones, and ethers. The diluent is mixed with the dispersion by low-shear techniques such as, for example, a paddle blade.

The diluted aqueous dispersion may then be applied to a cleaned substrate by spin coating, dip coating, meniscus coating, spray coating, or other suitable coating method. The method of coating is application specific. For example, a film is applied to a CRT surface by spin coating and a plastic by roll coating. After the dispersion has been applied, the film is heated for a sufficient time to remove the solvent. The drying time will vary depending upon the diluent composition.

Optionally, the dried film may be further treated to tailor the electrical and mechanical properties of the film. Such treatments include thermal treatment, chemical reduction, and the application of coatings.

In the case of thermal treatment, the film is heated to increase the electrical conductivity. More particularly, the film should be heated for a sufficient time at a sufficiently high temperature to cure the particles within the deposited film. Suitable temperatures include a range from about 300° C. to about 800° C.

The deposited film may also be treated by chemical reduction to increase the electrical conductivity.

Suitable coatings may be applied in a manner similar to that discussed above, for example, by spin coating. Suitable coatings include silane monomers or oligomers, such as but not limited to those formed from TEOS or TMOS, which may then be heated with the film to about 150° C. in air or a reducing environment, for a sufficient period of time to dry and cure the films. A suitable reducing environment is, for example, a mixture of hydrogen and inert gas (such as, for example, pre-purified nitrogen or argon).

The following examples describe specific embodiments of the present invention and their operation. These specific examples are not intended to limit the scope of the invention, as defined by the claims set forth herein, and equivalents thereof.

EXAMPLE 1

100 g of doped indium oxide, prepared by physical vapor synthesis (PVS), was added to 400 g of de-ionized water to make a 20 wt % slurry. The dispersion was high shear mixed and centrifuged. The clarified supernatant was collected and filtered, providing a concentrated aqueous doped indium oxide dispersion.

EXAMPLE 2

A dispersion was prepared in the same manner as set forth in Example 1, except an acidic or basic aqueous solution replaced de-ionized water for acidic or basic nanocrystalline powders, respectively.

EXAMPLE 3

A dispersion was prepared in the manner of Example 1 or 2, but ITO was replaced with other nanocrystalline metal and metal oxides such as, but not limited to, doped Tin Oxides, CuO, iron oxides, platinum, palladium, silver and gold.

EXAMPLE 4

Dispersions were prepared in the manner of Examples 1–3, but film-forming agents were added. The film-forming agents may be polymeric containing at least one hydroxyl group, such as, but not limited to, polyvinyl alcohol-, polyethylene glycol- or cellulose-based polymers; or may be a surfactant, such as but not limited to, organosilanes, ethoxylated alcohols, phosphate esters, glycerol esters, aliphatic polyethers and ethoxylated fatty esters. The film-forming agent was added to the dispersion at up to about 25 wt % of the metal or metal oxide content.

EXAMPLE 5

The aqueous dispersions in Examples 1–4 were formulated for coating by dilution to an appropriate weight percent with a diluent. The diluent composition may range from water to organic-based solvents. Diluent composition determines film drying time and is typically a mixture of low-, medium-, and high-boiling point solvents.

EXAMPLE 6

The ITO formulation prepared in Example 5 was applied to substrates and dried at 120° C. for 30 minutes. Films may be further heated to prepare films of controlled conductivity.

EXAMPLE 7

The ITO formulation prepared in Example 5 was applied to substrates and dried at 120° C. for 30 minutes. The deposited films were subsequently coated with a silane oligomer, such as but not limited to those formed from TEOS or TMOS, and heated to 150° C. in air or a reducing environment, such as but not limited to mixtures of hydrogen and inert gas (pre-purified nitrogen or argon), for a period of at least 15 minutes.

EXAMPLE 8

The ITO formulation prepared in Example 5 was applied to substrates and heated to between 350° C. and 800° C. to cure the particles within the deposited film. Deposited films were subsequently coated with a silane oligomer, such as but not limited to those formed from TEOS or TMOS, and heated to 150° C. in a reducing environment, such as but not limited to mixtures of hydrogen and inert gas (pre-purified nitrogen or argon), for a period of at least 15 minutes.

Transparency Results

Figure 2:
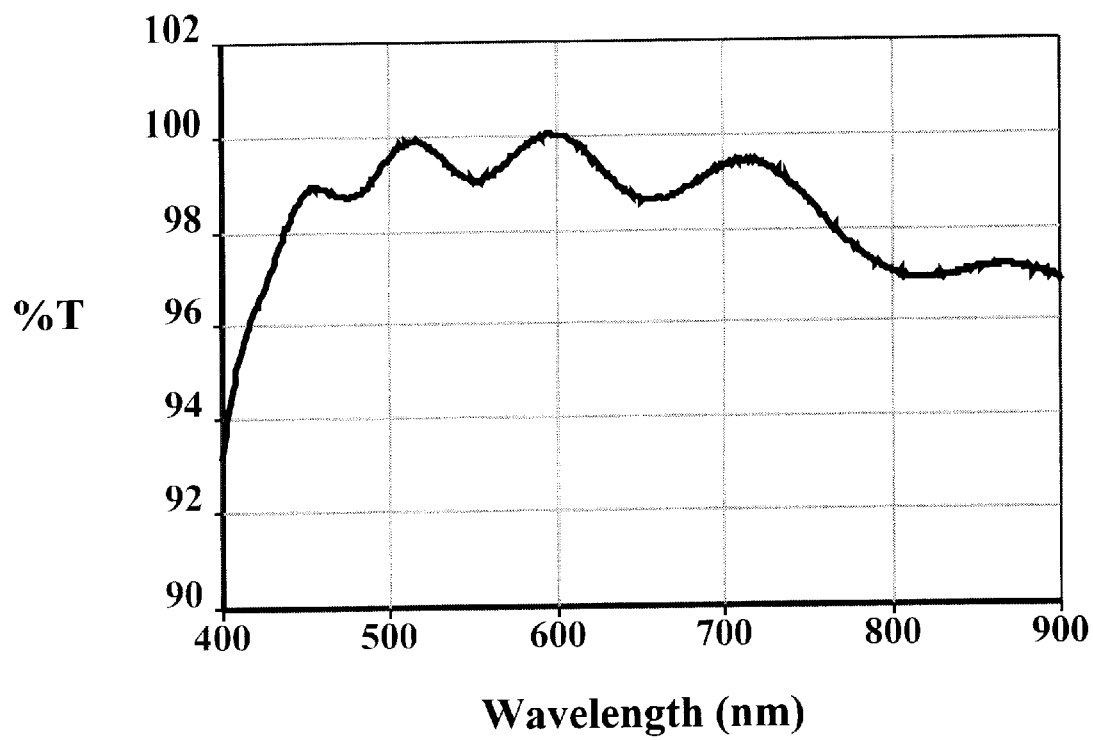
FIG. 2 is a plot of percentage transmittance as a function of wavelength for a film made in accordance with one of the examples (Example 8) set forth below.

FIG. 2 is a plot of percent transmission through a film coated on glass as a function of wavelength for a film made in accordance with Example 8. As shown in FIG. 2, the deposited film is characterized by a high degree of transmittance providing an optical transparency of 95%.

EXAMPLE 9

A coating was prepared in the accordance with Examples 7–8, but ITO nanocrystalline powder was replaced or combined with other nanocrystalline formulations containing other metal and metal oxides, such as, but not limited to, doped Tin Oxides, CuO, iron oxides, platinum, palladium, silver and gold. Sheet resistance measures 3,000 $\Omega$/and is stable at room temperature and 20% relative humidity. Transparency is quantified below.

| nm | 550 | 650 | 750 |
|---|---|---|---|
| % T | 86.1 | 92.6 | 96.9 |

Stability Results

Figure 3:
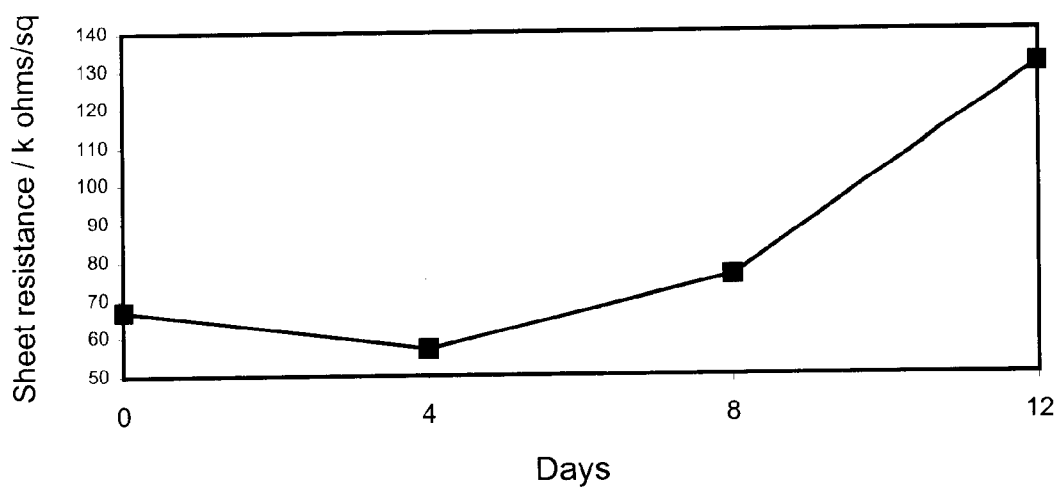
FIG. 3 is a plot that demonstrates the stability of an indium tin oxide dispersion prepared in accordance with another of the examples (Example 7) set forth below.

FIG. 3 is a plot that shows the stability of an aqueous dispersion of ITO prepared in accordance with the method disclosed herein. The ITO dispersion is formulated by diluting with the appropriate organic solvents, as discussed in Example 5. This formulation is applied to a substrate and processed, as in Examples 6 and 7. The sheet resistance of the film was measured and employed as a method to track the stability of the ITO dispersion. This stability test was done in a humidity chamber, under 80% relative humidity, at 40° C. Such testing accelerates the aging to a rate of approximately 4 to 1, where one day is equivalent to 4. At 12 days, the sheet resistance begins to rise, suggesting that the ITO dispersion has become relatively unstable. It is therefore evident shown that the present ITO dispersion is more stable than known dispersion compositions for transparent conductive coatings, which typically agglomerate within hours at 40° C., 80% relative humidity.

Conductivity Results

ITO films were deposited and dried at about 150° C. in air. Measured sheet resistance is approximately $1 \times 10^4$ $\Omega$/.

ITO films were deposited and dried at about 800° C. in air. Measured sheet resistance is approximately $1 \times 10^3$ $\Omega$/.

ITO films were deposited and dried at about 300° C. in a reducing atmosphere. Measured sheet resistance is approximately $2 \times 10^3$ $\Omega$/.

CuO films were deposited and dried at about 120° C. in reducing atmosphere. Measured sheet resistance is approximately 2 $\Omega$/.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features that come within the spirit and scope of the invention.

What is claimed is:

1. A process for forming a substantially transparent, electrically conductive film having a sheet resistance of less than $10^5$ ohms/square comprising the steps of:
    (a) adding a nanocrystalline material to water, said nanocrystalline material comprising primary particles of metal or metal oxide having a substantially spherical shape;
    (b) mixing the nanocrystalline material and the water to form a substantially stable aqueous dispersion;
    (c) adding a film forming agent to the aqueous dispersion in an amount effective for the dispersion to provide a uniform, defect-free film when the dispersion is applied to a substrate, said film having a sheet resistance of less than $10^5$ ohms/square;

(d) adding a diluent to said aqueous dispersion to make a formulation; and (e) applying said formulation to a substrate.

2. The process of claim 1 wherein the film forming agent is added to the aqueous dispersion in an amount up to about 25% by weight of the nanocrystalline material.

3. The process of claim 1 wherein said film forming agent contains at least one hydroxyl group.

4. The process of claim 1 wherein said film forming agent comprises a cellulose-based polymer in an amount of up to about 25% by weight of the metal or metal oxide content.

5. The process of claim 1, wherein said film forming agent comprises a cellulose-based polymer in an amount of up to about 5% by weight of the metal or metal oxide content.

6. The process of claim 1 wherein said film forming agent is soluble in organic and aqueous phases.

7. The process of claim 6 wherein the film forming agent is present in the dispersion at about 5% to about 15% by weight of the metal or metal oxide content.

8. The process of claim 1 comprising the further step of heating the substrate to substantially remove the water and the diluent, thereby forming a film on the substrate.

9. The process of claim 8 further comprising heating the substrate to cure the nanocrystalline particles within the film, said heating being done to a temperature between about 300° C. and about 800° C.

10. The process of claim 9 further comprising coating the film with silane monomers or oligomers.

11. The process of claim 8 further comprising coating the film with silane monomers or oligomers.

12. The process of claim 8 further comprising the step of heating the film in a reducing environment for a period of time sufficient to reduce the sheet resistance of the film.

13. The process of claim 1 wherein the nanocrystalline material is added to the water in an amount ranging from about 1 to about 40% by weight.

14. The process of claim 1 wherein the nanocrystalline material is added to the water in an amount ranging from about 7 to about 30% by weight.

15. The process of claim 1 wherein the diluent is added in added in a sufficient quantity to make a formulation comprising from 0.1 to 5 wt % solids.

16. The process of claim 1 wherein the nanocrystalline material is selected from doped tin oxides, CuO, iron oxides, platinum, palladium, silver and gold.

17. A substantially stable aqueous dispersion of metal oxide particles, suitable for forming a transparent conductive coating, prepared according to the process of claim 1.

18. A process for making a substantially stable aqueous dispersion of nanocrystalline particles suitable for use in forming a transparent conductive coating having a sheet resistance of less than $10^5$ ohms/square, comprising the steps of:

(a) adding a nanocrystalline material to water, said nanocrystalline material comprising primary particles of metal or metal oxide having a substantially spherical shape;

(b) mixing the nanocrystalline material and the water to form a substantially stable aqueous dispersion; and (c) adding a film forming agent to the dispersion in an amount effective for the dispersion to provide a uniform, defect-free film when applied to a substrate; said film having a sheet resistance of less than $10^5$ ohms/square.

19. The process of claim 18 wherein the nanocrystalline material comprises indium tin oxide and is present in an amount of from about 1% to about 25% by weight of the aqueous dispersion.

20. The process of claim 18 wherein the nanocrystalline material comprises antimony tin oxide and is present in an amount of from about 1% to about 35% by weight of the aqueous dispersion.

21. The process of claim 18 wherein the film forming agent is added in an amount up to about 25% by weight of the nanocrystalline material.

22. The process of claim 18 wherein said film forming agent contains at least one hydroxyl group.

23. The process of claim 18 wherein said film forming agent comprises a cellulose-based polymer in an amount of up to about 25% by weight of the nanocrystalline material content.

24. The process of claim 18 wherein said film forming agent comprises a cellulose-based polymer in an amount up to about 5% by weight of the nanocrystalline material content.

25. The process of claim 18 wherein said film forming agent is soluble in organic and aqueous phases.

26. The process of claim 18 wherein the film agent is present in the dispersion in an amount of about 5% to about 15% by weight of the nanocrystalline material content.

27. The process of claim 18 comprising the further step of adding a diluent to said aqueous solution.

28. The process of claim 27 wherein the diluent is added in added in a sufficient quantity to make a formulation comprising from 0.1 to 5 wt % solids.

29. The process of claim 18 wherein the nanocrystalline material is present in the dispersion in an amount ranging from about 1 to about 40% by weight of the dispersion.

30. The process of claim 18 wherein the nanocrystalline material is present in the dispersion in an amount ranging from about 7 to about 30% by weight of the dispersion.

31. The process of claim 18 wherein the nanocrystalline material is selected from doped tin oxides, CuO, iron oxides, platinum, palladium, silver and gold.

32. A substantially stable aqueous dispersion of metal oxide particles, suitable for forming a transparent conductive coating, prepared according to the process of claim 18.

* * * * *